United States Patent [19]

Tabara et al.

[11] Patent Number: 5,287,290
[45] Date of Patent: Feb. 15, 1994

[54] METHOD AND APPARATUS FOR CHECKING A MASK PATTERN

[75] Inventors: Katsuji Tabara; Satoshi Akutagawa, both of Kawasaki, Japan

[73] Assignee: Fujitsu Limited, Kawasaki, Japan

[21] Appl. No.: 989,459

[22] Filed: Dec. 10, 1992

Related U.S. Application Data

[63] Continuation of Ser. No. 491,108, Mar. 9, 1990, abandoned.

[30] Foreign Application Priority Data

Mar. 10, 1989 [JP] Japan ................... 1-058152

[51] Int. Cl.$^5$ ........................................... G06F 15/46
[52] U.S. Cl. ........................................ 364/489; 364/488; 364/559; 382/33; 356/398; 250/491.1
[58] Field of Search ..................... 364/488–491, 364/559; 382/8, 16, 28, 33, 36; 356/391–394, 398; 250/491.1

[56] References Cited

U.S. PATENT DOCUMENTS 4,559,603 12/1985 Yoshikawa ............... 364/491
4,600,996 7/1986 Kawauchi ............... 364/491

OTHER PUBLICATIONS

"An Automatic Optical Printed Circuit Inspection System" by Restrick, III, SPIE vol. 116 Solid State Imaging Devices, 1977, pp. 76-81.

"An Automatic Inspection System for Printed Wiring Board Masks" by Goto et al., Pattern Recognition, vol. 12, 1980, pp. 443-455.

*Primary Examiner*—Vincent N. Trans
*Attorney, Agent, or Firm*—Staas & Halsey

[57] ABSTRACT

A method and an apparatus for checking a mask pattern including a plurality of mask pattern regions formed based on different design pattern rules. The method includes the steps of: defining each of the mask pattern regions as a check object region; setting a defect detection reference corresponding to a respective design pattern rule of the mask pattern regions for each of the check object regions; and detecting presence or absence of defects in the mask pattern based on the respective defect detection reference for each of the check object regions. By these steps, it is possible to realize reduction in check time of the mask pattern and improvement in throughput of the checking apparatus, without necessitating discrimination processing of pseudo defects in the mask pattern.

5 Claims, 11 Drawing Sheets

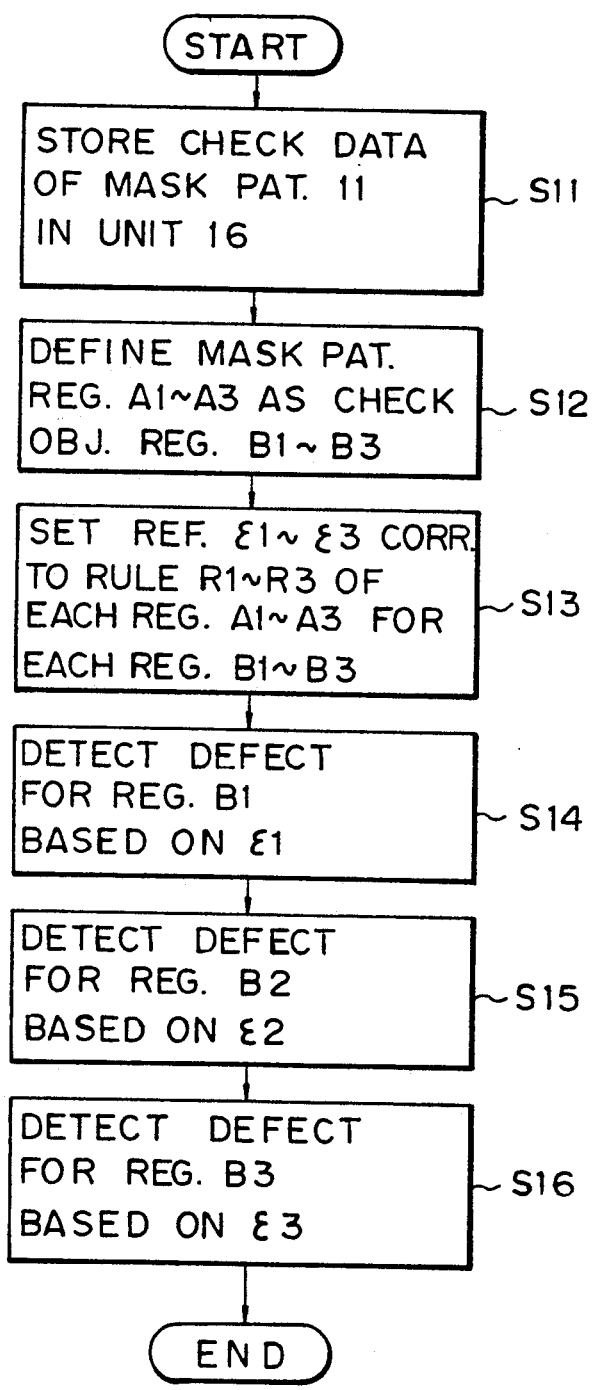

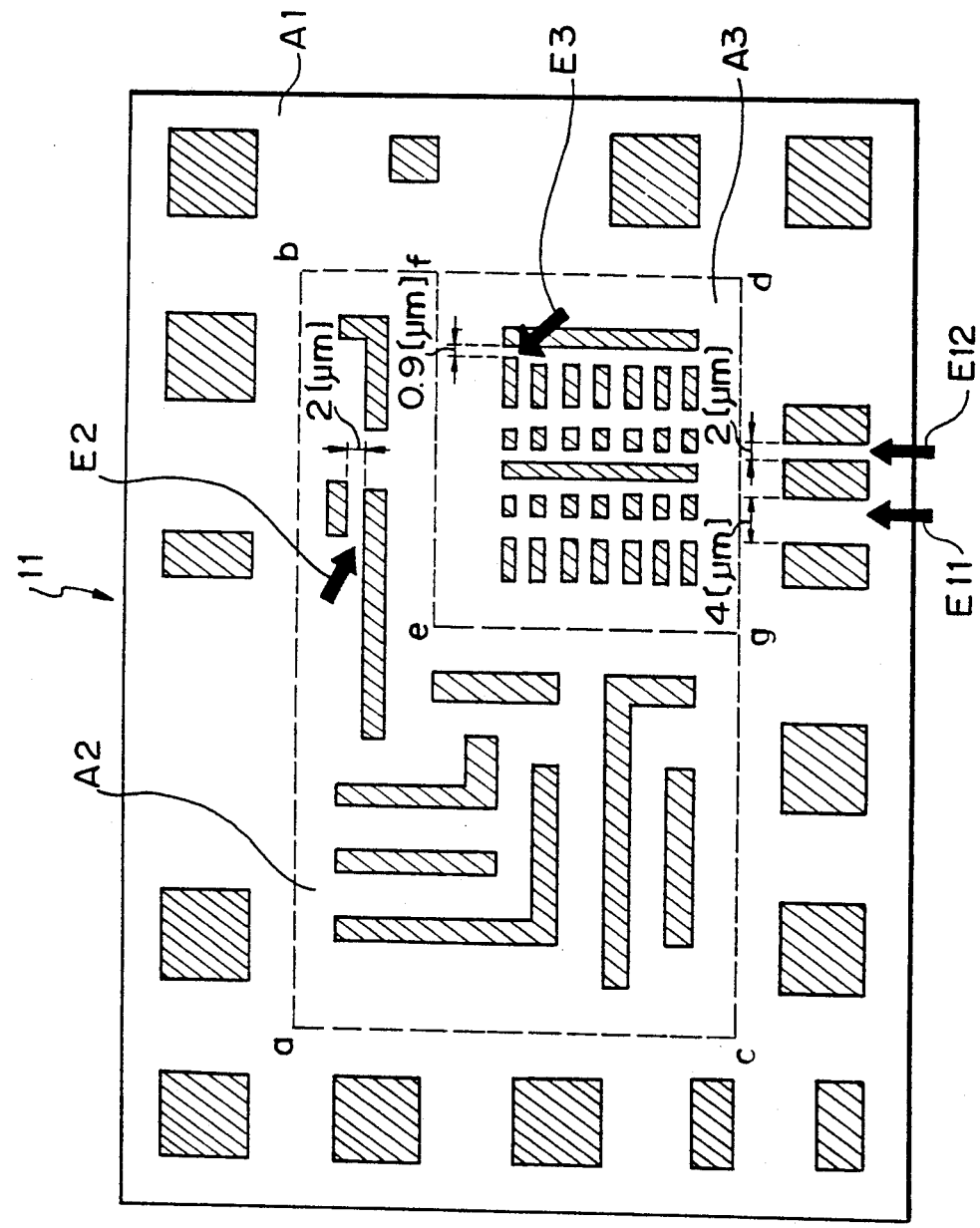

METHOD AND APPARATUS FOR CHECKING A MASK PATTERN

This application is a continuation, of U.S. application Ser. No. 07/491,108, filed Mar. 9, 1990, now abandoned.

BACKGROUND OF THE INVENTION

1. Field of the Invention

The present invention relates to a technique of checking a mask pattern. More particularly, it relates to a method and apparatus for checking a mask pattern formed based on two or more design rules in accordance with functional contents of a semiconductor element.

2. Description of the Related Art

With recent ultra-fine fabrication and increased functions of semiconductor integrated circuit devices, a single mask pattern has included a plurality of mask pattern regions formed based on two or more design pattern rules.

Conventionally, defects in a mask pattern formed based on different design pattern rules have been detected by changing a defect detection reference for each of the mask pattern regions and in turn checking the entire mask pattern repeatedly.

Therefore, where a certain mask pattern region is checked according to a defect detection reference which is not adapted to the mask pattern region, a process must be carried out to discriminate whether a detected defect is a real one or a pseudo one. This causes a problem in that checking takes a long time resulting in a lowering of throughput of the checking apparatus.

In view of the problem, a technique capable of checking a mask pattern efficiently and in a short time has been demanded.

SUMMARY OF THE INVENTION

An object of the present invention is to realize a reduction in checking time of a mask pattern and an improvement in throughput of the checking apparatus, without necessitating a discrimination process for pseudo defects in the mask pattern.

According to one aspect of the present invention, there is provided a method of checking a mask pattern including a plurality of mask pattern regions formed based on different design pattern rules, the method including the steps of: defining each of the mask pattern regions as a check object region; setting a defect detection reference corresponding to a respective design pattern rule of the mask pattern regions for each of the check object regions; and detecting presence or absence of defects in the mask pattern based on the respective defect detection reference for each of the check object regions.

Also, according to another aspect of the present invention, there is provided an apparatus for checking a mask pattern including a plurality of mask pattern regions formed based on different design pattern rules, the apparatus including: a first unit for storing information concerning defect detection references corresponding to each of the design pattern rules; a second unit for judging a check object region and setting a defect detection reference corresponding to the judged check object region based on the defect detection references from the first unit; a third unit for acquiring an image of the mask pattern; and a fourth unit for comparing data of the image acquired by the third unit with data of the defect detection reference set by the second unit and judging the comparison result to detect defects of the mask pattern.

BRIEF DESCRIPTION OF THE DRAWINGS

Other objects and features of the present invention will be described in detail hereinafter by way of preferred embodiments with reference to the accompanying drawings, in which:

FIG. 5 is a flowchart representing the mask pattern checking method as the first embodiment of the present invention;

FIGS. 6A and 6B are diagrams for supplementarily explaining the flowchart shown in FIG. 5;

DESCRIPTION OF THE PREFERRED EMBODIMENTS

For a better understanding of the preferred embodiments of the present invention, the problem in the prior art will be explained with reference to FIGS. 1A and 1B.

Figure 1A:
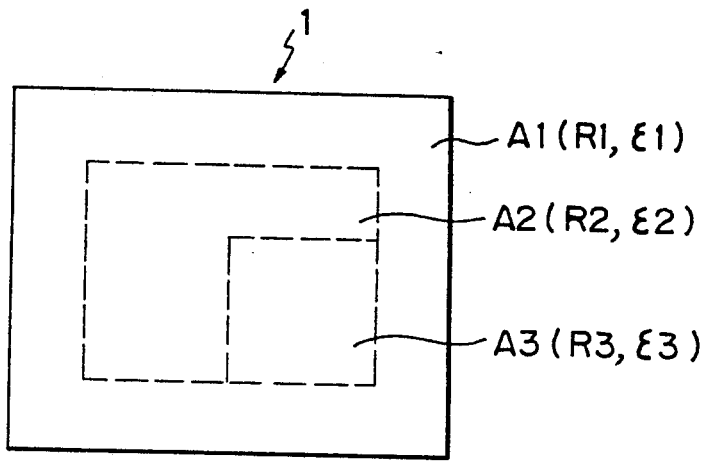
FIGS. 1A and 1B are diagrams for explaining a prior art mask pattern checking method.

FIG. 1A illustrates a mask pattern applied to a semiconductor integrated circuit device. The illustrated mask pattern 1 is divided into three mask pattern regions A1~A3 formed based on different design pattern rules R1~R3, respectively.

The mask pattern region A1 corresponds to a region for forming pad electrodes which is provided in the circumferential portion of the semiconductor integrated circuit device, and a defect detection reference $\epsilon1$ is allocated thereto. The mask pattern region A2 corresponds to a region for forming selection gate transistors and a defect detection reference $\epsilon2$ is allocated thereto. Also, the mask pattern region A3 corresponds to a region for forming memory elements and a defect detection reference $\epsilon3$ is allocated thereto. Each of the defect detection references is defined, for example, by a minimum permissible space between adjacent patterns. In this case, the relation between the defect detection references is as follows:

$$\epsilon1 > \epsilon2 > \epsilon3$$

Figure 1B:
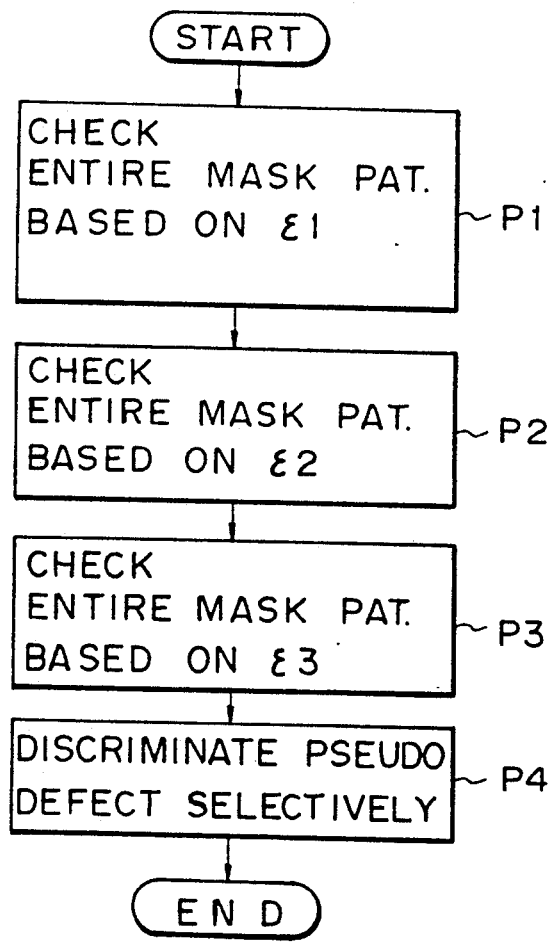

FIG. 1B illustrates a flowchart representing a prior art mask pattern checking method.

First, at step P1, the entire mask pattern 1 is checked based on the defect detection reference $\epsilon1$ irrespective of the mask pattern regions A1 to A3. By this process, real defects are detected in the mask pattern region A1, and pseudo defects are detected in the mask pattern regions A2 and A3.

Next, at step P2, the entire mask pattern 1 is checked based on the defect detection reference $\epsilon 2$ in a like manner. By this process, real defects are detected in the mask pattern region A2, and pseudo defects are detected in the mask pattern region A3.

Next, at step P3, the entire mask pattern 3 is checked based on the defect detection reference $\epsilon 3$ in a like manner.

Finally, at step P4, the pseudo defects are selectively discriminated. In this case, the pseudo defects in the mask pattern regions A2 and A3 are removed with respect to the mask pattern region A1 and the pseudo defects in the mask pattern region A3 are removed with respect to the mask pattern region A2, so that real defects are detected with respect to each mask pattern region $A1 \sim A3$.

Namely, every time the defect detection references $\epsilon 1$ to $\epsilon 3$ are changed, the entire mask pattern 1 is repeatedly checked.

Accordingly, when the numbers of the design pattern rules R1, R2, R3, . . . , and the defect detection references $\epsilon 1$, $\epsilon 2$, $\epsilon 3$, . . . , are increased due to high degree of integration and high density of the semiconductor integrated circuit device, the number of times the entire mask pattern is checked is accordingly increased. This increase in the number of checks makes checking time longer and introduces troublesome discrimination process for pseudo defects. Namely, the time taken to check a single mask pattern is increased and the throughput of the checking apparatus is lowered, so that a problem occurs in that it is impossible to efficiently carry out the check.

Figure 2A:
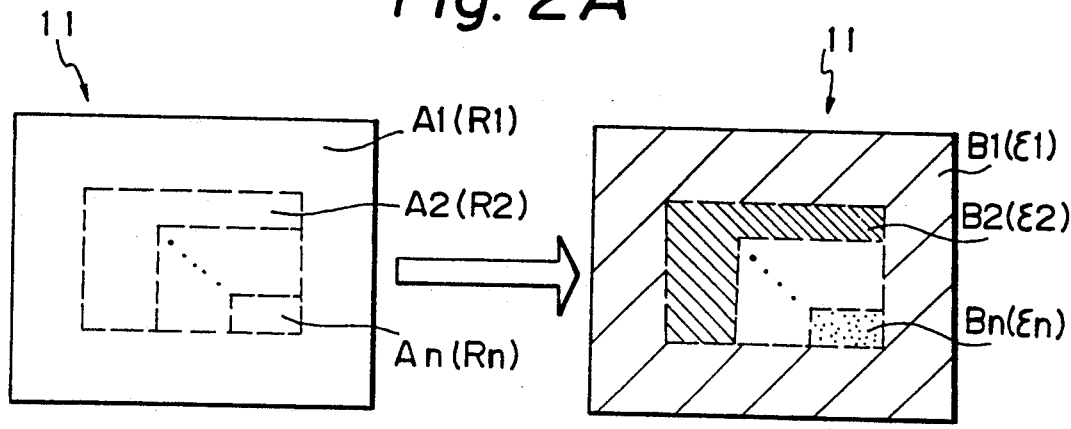
FIGS. 2A and 2B are diagrams for explaining the principle of the mask pattern checking method according to the present invention.
Figure 2B:
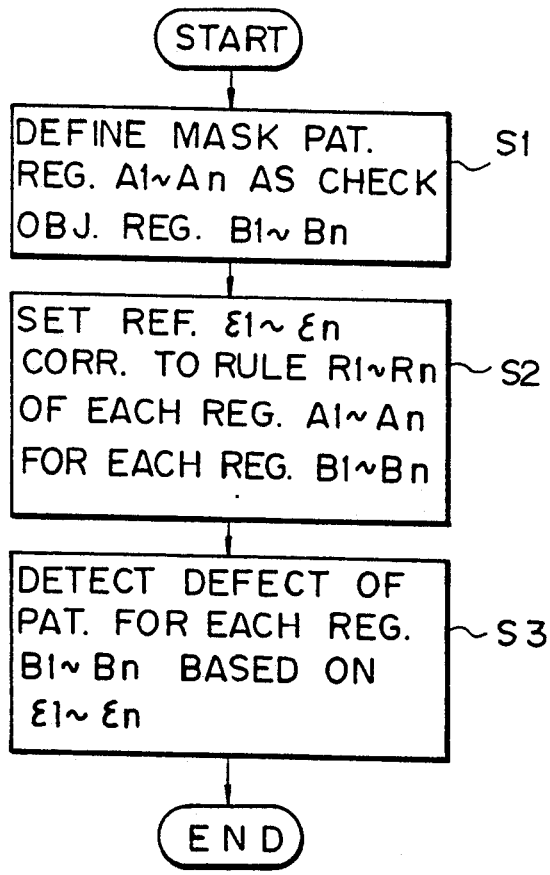

FIGS. 2A and 2B illustrate the principle of the mask pattern checking method according to the present invention.

In FIG. 2A, reference 11 denotes a mask pattern which is an object to be checked. The mask pattern 11 is divided into a plurality of mask pattern regions $A1 \sim An$ formed based on different design pattern rules $R1 \sim R3$, respectively. References $B1 \sim Bn$ denote check object regions and references $\epsilon 1 \sim \epsilon n$ denote defect detection references.

Note, each of the design pattern rules $R1 \sim Rn$ is defined in consideration of various requirements, e.g., functional conditions of circuits formed on the respective region (electrical requirements), aberration of lenses used in the mask pattern checking apparatus (optical requirements), and the like. Also, Each of the defect detection references $\epsilon 1 \sim \epsilon n$ is defined by a minimum permissible space between adjacent patterns.

As shown in FIG. 2B, the mask pattern checking method according to the present invention fundamentally includes three steps, i.e., step (S1) of defining the mask pattern regions $A1 \sim An$ as the check object regions $B1 \sim Bn$, respectively; step (S2) of setting the defect detection reference $\epsilon 1 \sim \epsilon n$ corresponding to the respective design pattern rule $R1 \sim Rn$ of the mask pattern regions $A1 \epsilon An$ for each of the check object regions $B1 \sim Bn$; and step (S3) of detecting presence or absence of defects of the mask pattern 11 based on the respective defect detection reference $\epsilon 1 \sim \epsilon n$ for each of the check object regions $B1 \sim Bn$.

According to the above approach, defect detection is carried out independently for each of the check object regions $B1 \sim Bn$ based on the respective defect detection reference $\epsilon 1 \sim \epsilon n$. In other words, with respect to the check object regions other than a check object region Bi corresponding to the defect detection reference $\epsilon i$, defect detection based on the reference $\epsilon i$ is not carried out.

Therefore, it becomes possible to omit the checking of mask patterns in the check object regions not corresponding to the respective defect detection reference and thus reduce the total check time. Also, discrimination process for pseudo defects occurring due to the difference of defect detection references (as seen in the prior art) becomes unnecessary. As a result, it is possible to increase efficiency in the checking of the entire mask pattern and improve the throughput.

Next, a first embodiment of the present invention will be explained with reference to FIGS. 3 to 6B.

Figure 3:
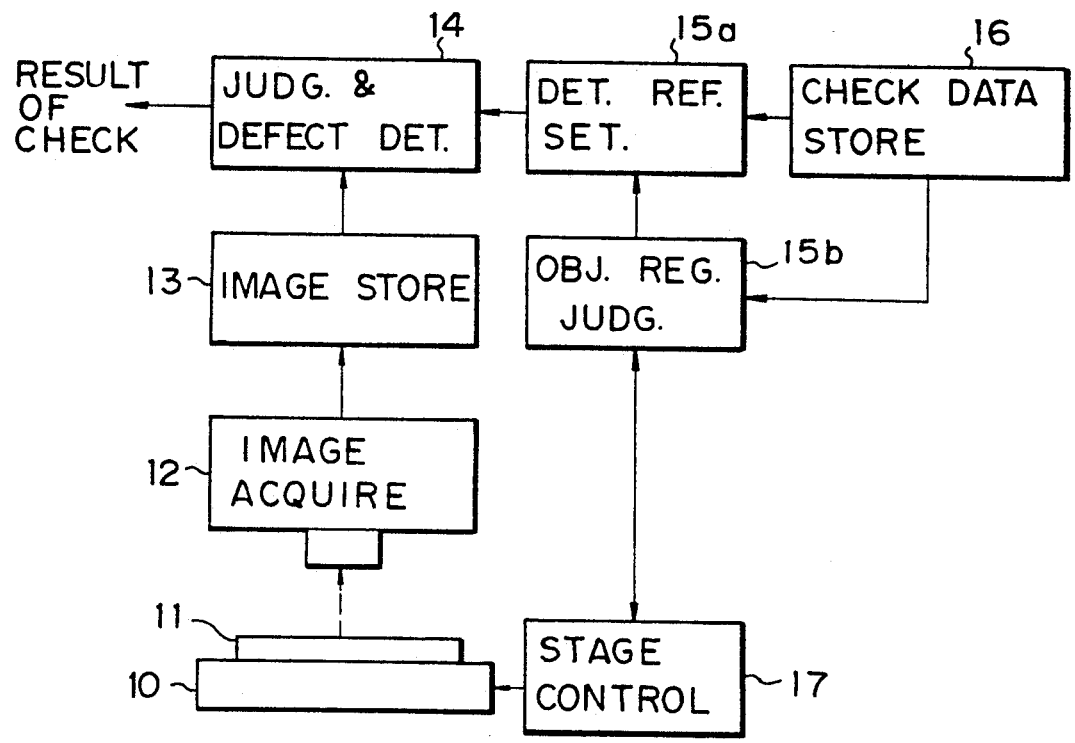
FIG. 3 is a block diagram illustrating a constitution of the mask pattern checking apparatus applied to first and second embodiments of the present invention.

FIG. 3 illustrates a constitution of the mask pattern checking apparatus applied to the present embodiment. The illustration shows an arrangement by which defects are detected directly from a mask pattern actually formed.

In FIG. 3, reference 10 denotes a stage; reference 11 a mask pattern of integrated circuits formed on a semiconductor chip placed on the stage 10; reference 12 an image acquirement unit for acquiring the image of the mask pattern 11 to obtain binary coded data and constituted by an optoelectronic image pick-up apparatus, or the like; reference 13 an image store unit for storing the binary coded image data from the unit 12; and reference 14 a judgement and defect detection unit for comparing the acquired image data with defect detection reference data and judging the comparison result to detect defects of the mask pattern 11. The unit 14 carries out processing equivalent to the step S3 shown in FIG. 2B.

Also, reference 15a denotes a detection reference setting unit for setting and changing a defect detection reference based on information indicating a corresponding check object region (object region information) and defect detection reference information concerning the check object region, and reference 15b denotes an object region judgement unit for judging a check object region to output the object region information based on information concerning positions of the mask pattern 11 (position information) and information concerning coordinates of the object region (coordinate information). The units 15a and 15b carry out process equivalent to the steps S1 and S2 shown in FIG. 2B.

Reference 16 denotes a check data store unit for storing the coordinate information (data), the defect detection reference information (data), and data concerning design pattern rules. Reference 17 denotes a stage control unit for driving the stage 10 placing the mask pattern 11 thereon based on the above coordinate information and outputting the above position information.

Figure 4:
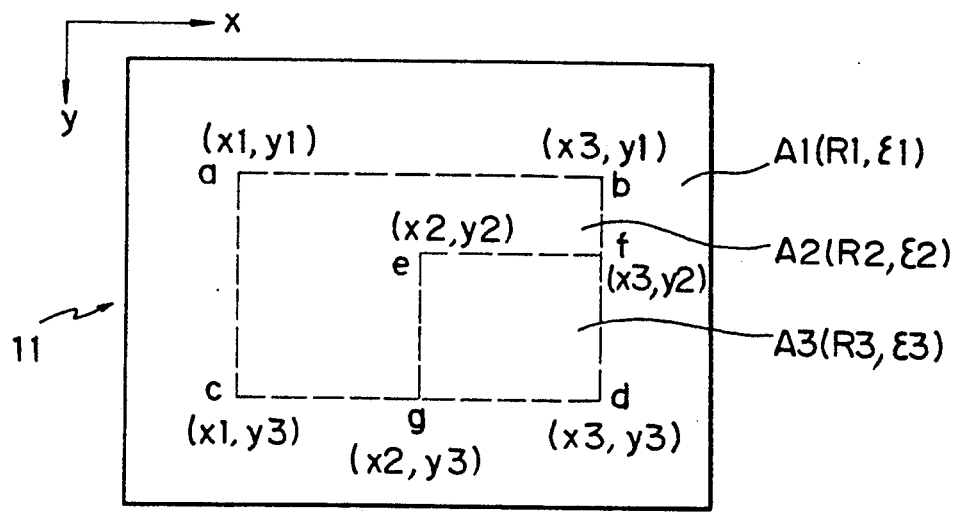
FIG. 4 is a diagram for explaining the mask pattern applied to each embodiment.

FIG. 4 illustrates a mask pattern applied to the present embodiment. In the illustration, the mask pattern 11 is divided into three mask pattern regions $A1 \sim A3$ formed based on different design pattern rules $R1 \sim R3$, respectively. Defect detection references $\epsilon 1 \sim \epsilon 3$ different from each other are allocated to the mask pattern regions $A1 \sim A3$, respectively.

The mask pattern region A1 is defined by a region other than the region surrounded by coordinates a (x1, y1), b (x3, y1), d (x3, y3) and c (X1, y3). Also, the mask pattern region A2 is defined by the region surrounded by coordinates a (x1, y1), b (x3, y1), f (x3, y2), e (x2, y2), g (x2, y3) and c (X1, y3). Furthermore, the mask pattern region A3 is defined by the region surrounded by coordinates e (x2, y2), f (x3, y2), d (x3, y3) and g (X2, y3).

Figure 6A:
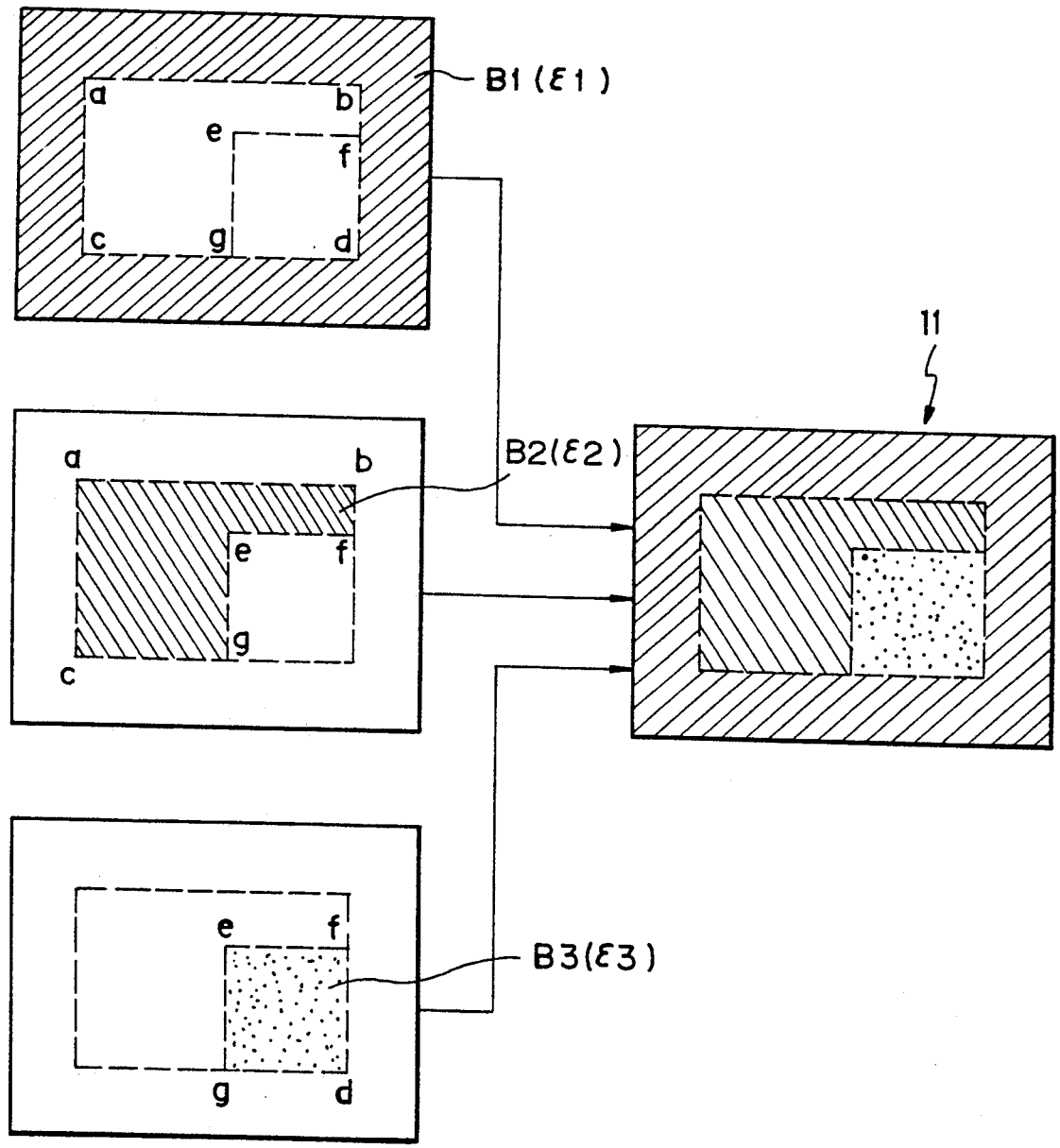

FIG. 5 illustrates a flowchart representing the mask pattern checking method as the first embodiment of the present invention, and FIGS. 6A and 6B are supplementary explanatory diagrams of the flowchart.

Assuming that, with respect to the mask pattern region A1, data of the design pattern rule R1 is 6 μm and data of the defect detection reference $\epsilon$1 is 5 μm; with respect to the mask pattern region A2, data of the design pattern rule R2 is 3 μm and data of the defect detection reference $\epsilon$2 is 2.5 μm; and with respect to the mask pattern region A3, data of the design pattern rule R3 is 1 μm and data of the defect detection reference $\epsilon$3 is 1 μm.

First, at step S11, the coordinate data, defect detection reference data and design pattern rule data concerning the mask pattern 11 are stored in the check data store unit 16. Concretely, the coordinate data a~g (see FIG. 4) defining each mask pattern region A1~A3, data 6 μm, 3 μm and 1 μm of each design pattern rule R1~R3 and data 5 μm, 2.5 μm and 1 μm of each defect detection reference $\epsilon$1~$\epsilon$3 are stored in the check data store unit 16.

Next, at step S12, the mask pattern regions A1~A3 are defined as the check object regions B1~B3, respectively. In this case, as shown in FIG. 6A, the check object region B1 corresponds to a region other than the region surrounded by coordinates a (x1, y1), b (x3, y1), d (x3, y3) and c (X1, y3) and the defect detection reference $\epsilon$1 is allocated thereto. Also, the check object region B2 corresponds to the region surrounded by coordinates a (x1, y1), b (x3, y1), f (x3, y2), e (x2, y2), g (x2, y3) and c (X1, y3) and the defect detection reference $\epsilon$2 is allocated thereto. Furthermore, the check object region B3 corresponds to the region surrounded by coordinates e (x2, y2), f (x3, y2), d (x3, y3) and g (X2, y3) and the defect detection reference $\epsilon$3 is allocated thereto.

Next, at step S13, the defect detection references $\epsilon$1~$\epsilon$3 corresponding to the design pattern rules R1~Rn of the mask pattern regions A1~An are set for the check object regions B1~Bn, respectively. For example, when the check object region B1 is designated, the detection reference setting unit 15a and object region judgement unit 15b (see FIG. 3) send the coordinate data a (x1, y1), b (x3, y1), d (x3, y3) and c (X1, y3) to the stage control unit 17 and send the data (5 μm) of the defect detection reference $\epsilon$1 to the judgement and defect detection unit 14.

Next, at step S14, the presence or absence of defects are detected based on the defect detection reference $\epsilon$1 for the check object region B1. In this case, the image acquirement unit 12 acquires only the image of the mask pattern region A1 and generates binary coded data thereof. The binary coded image data is sent via the image store unit 13 to the judgement and defect detection unit 14. The unit 14 carries out defect detection based on the data (5 μm) of the defect detection reference $\epsilon$1. For example, as shown in FIG. 6B, where portions at which pattern-to-pattern space (4 μm, 2 μm) is below the defect detection reference value (5 μm) are included in the mask pattern region A1, the portions are detected as defects E11, E12.

Next, at step S15, the presence or absence of defects are detected based on the defect detection reference $\epsilon$2 for the check object region B2. In this case, the image acquirement unit 12 acquires only the image of the mask pattern region A2. In the same manner as step S14, the judgement and defect detection unit 14 carries out defect detection based on the data (2.5 μm) of the defect detection reference $\epsilon$2. For example, where a portion at which pattern-to-pattern space (2 μm) is below the defect detection reference value (2.5 μm) is included in the mask pattern region A2 (see FIG. 6B), the portion is detected as defect E2.

Finally, at step S16, the presence or absence of defects are detected based on the defect detection reference $\epsilon$3 for the check object region B3. In this case, the image acquirement unit 12 acquires only the image of the mask pattern region A3. In the same manner as step S14, the judgement and defect detection unit 14 carries out defect detection based on the data (1 μm) of the defect detection reference $\epsilon$3. For example, where a portion at which pattern-to-pattern space (0.9 μm) is included in the mask pattern region A3 (see FIG. 6B), the portion is detected as defect E3.

As explained above, according to the first embodiment, the defects E11, E12, E2 and E3 of the mask pattern 11 are detected for each of the check object regions B1~B3 (mask pattern regions A1~A3) based on the data 5 μm, 2.5 μm and 1 μm of the defect detection reference $\epsilon$1~$\epsilon$3. In other words, with respect to the check object regions B2, B3 other than the check object region B1 corresponding to the data 5 μm of the defect detection reference $\epsilon$1, defect detection based on the reference $\epsilon$1 is not carried out. Therefore, it is possible to omit the useless check and thus to reduce the total checking time. Also, discrimination process for pseudo defects as seen in the prior art becomes unnecessary. This contributes to an improvement in throughput.

Next, a second embodiment of the present invention will be explained with reference to FIGS. 7 to 9.

Figure 7:
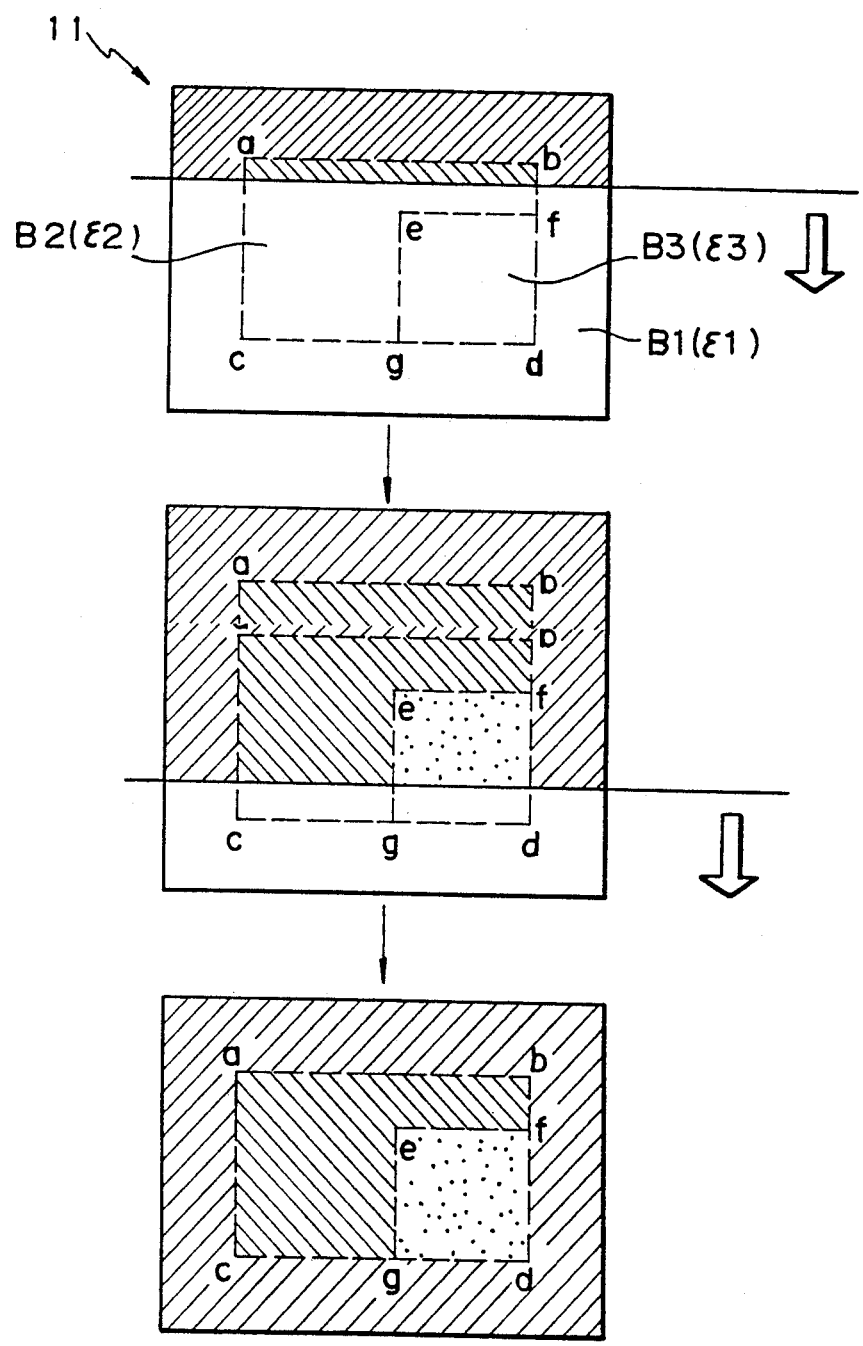
FIG. 7 is a diagram for explaining the mask pattern checking method as the second embodiment of the present invention.

FIG. 7 is an explanatory diagram of the mask pattern checking method as the second embodiment of the present invention.

The present embodiment is different from the first embodiment in that, when the mask pattern 11 placed on the stage 10 is moved by the stage control unit 17 (see FIG. 3) and, relatively, the image acquirement unit 12 scans the entire mask pattern 11 in a predetermined direction (in FIG. 7, in the upper to lower direction), the defect detection references $\epsilon$1~$\epsilon$3 are changed according to the change in the check object regions B1~B3 to detect defects for each of the check object regions.

Assuming that the data of the coordinates a~g (see FIG. 4) defining each mask pattern region A1~A3 and the defect detection references $\epsilon$1~$\epsilon$3 are the same as those in the first embodiment, first, with respect to the acquired image data corresponding to the check object region B1, defect detection is carried out based on the data 5 μm of the defect detection reference $\epsilon$1.

Next, when the stage 10 placing the mask pattern 11 thereon is moved and the image acquirement unit 12 enters the check object region B2, defect detection is carried out based on the data 2.5 μm of the defect detection reference $\epsilon$2 with respect to the acquired image data corresponding to the check object region B2.

Note, the change of the check object region during the scanning operation is carried out by the units 15a and 15b (see FIG. 3) based on the coordinate data defining the predetermined mask pattern regions A1~A3. The coordinate data is preset in a register (not shown) in the check data store unit 16. On the other hand, the stage control unit 17 includes a register (not shown) for storing data concerning the movement of the stage 10. When the counted value in the register of the unit 17 coincides with that of the unit 16, for example, the stage 10 is temporarily stopped and magnification of lenses used in the image acquirement unit 12 is then changed.

In a like manner, when the image acquirement unit 12 enters the check object region B3, defect detection is carried out based on the data 1 μm of the defect detection reference ε3 with respect to the acquired image data corresponding to the check object region B3.

Figure 8:
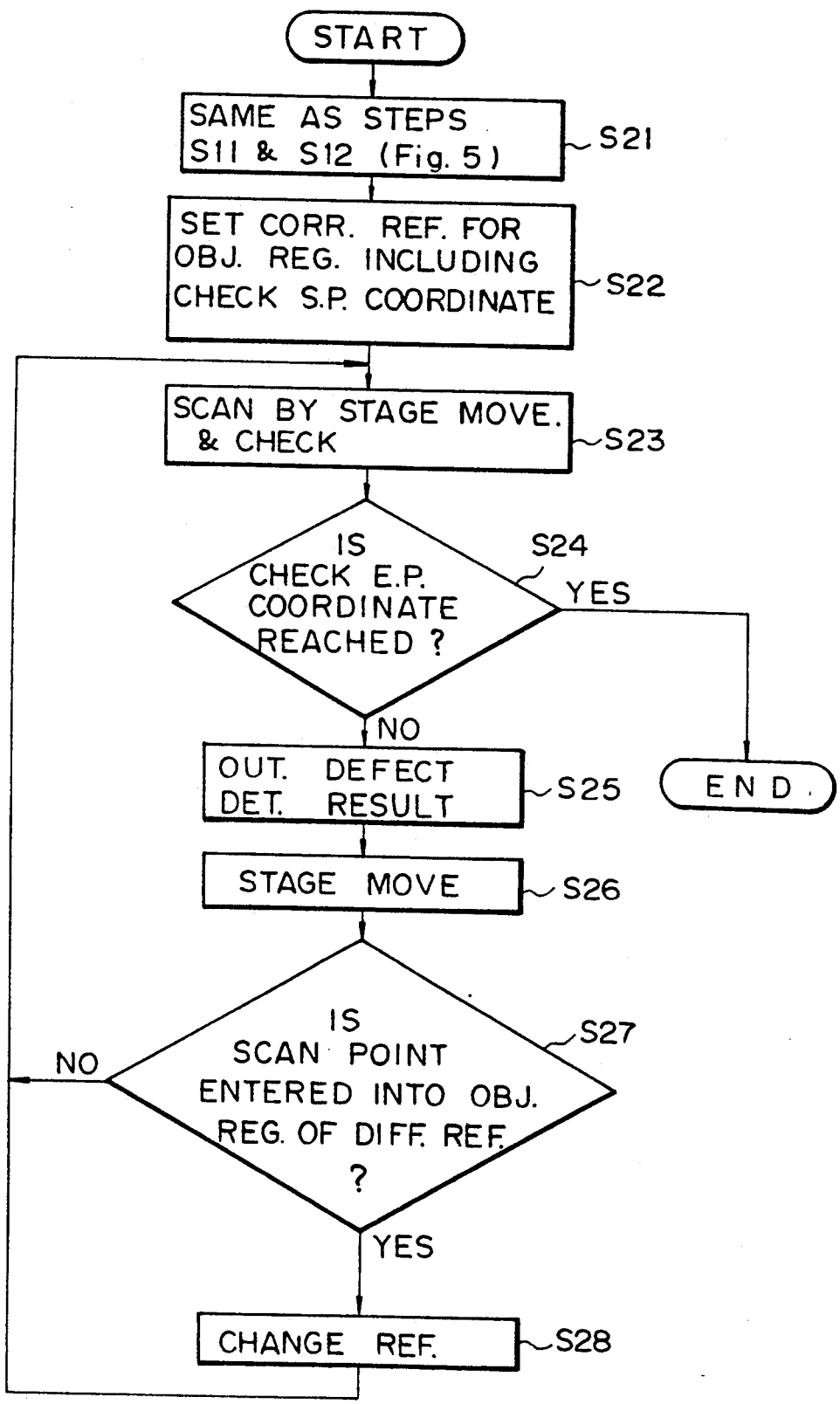
FIGS. 8 and 9 are flowcharts representing the mask pattern checking method according to the second embodiment.
Figure 9:
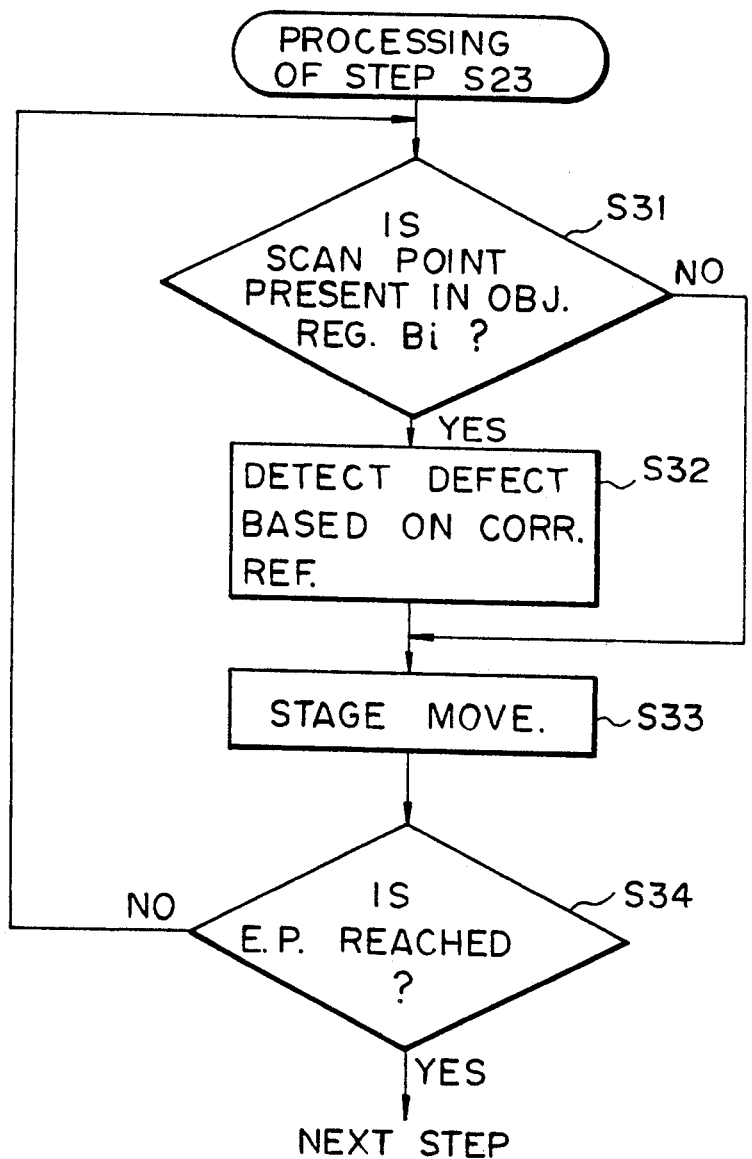

FIGS. 8 and 9 illustrate flowcharts representing the mask pattern checking method according to the second embodiment.

Referring to FIG. 8, processing of step S21 is the same as the processings of steps S11, S12 (see FIG. 5) and thus the explanation thereof is omitted.

At step S22, a corresponding defect detection reference is set for a check object region including a check starting point (s.p) coordinate. In the case of FIG. 7, the defect detection reference ε1 is set for the corresponding check object region B1. At step S23, the mask pattern 11 is scanned by moving the stage 10 and the check thereof is started. Processing of step S23 will be explained in detail later.

Next, at step S24, a judgement of whether a check ending point (e.p.) coordinate is reached within the check object region B1 (YES) or not (NO) is carried out and, if the result is YES, this flow comes to an END. If the result is NO, the control proceeds to step S25. At step S25, defect detection is carried out with respect to the check object region B1 and the result thereof is output. At next step S26, the stage 10 is further moved by the stage control unit 17.

Next, at step S27, a judgement of whether a scanning point is entered into a check object region corresponding to a different defect detection reference (YES) or not (NO) is carried out. In the case of FIG. 7, the scanning point is entered into the check object region B2 of reference ε2. If the result at step S27 is NO, the control returns to step S23. If the result is YES, the control proceeds to step S28. At step S28, the defect detection reference is changed from ε1 to ε2 and the control then returns to step S23.

The above explained processings are repeatedly carried out until the scanning of the entire mask pattern 11 is completed.

FIG. 9 shows the processing of step S23.

At step S31, a judgement of whether a scanning point is present in the current check object region Bi (in this case, B1) (YES) or not (NO) is carried out, and if the result is NO, the control jumps to step S33. If the result is YES, the control proceeds to step S32. At step S32, the defect detection is carried out based on the corresponding check object region B1. At next step S33, the stage 10 is moved by the stage control unit 17.

Next, at step S34, a judgement of whether the check ending point (e.p.) coordinate is reached (YES) or not (NO) is carried out. If the result at step S27 is NO, the control returns to step S31. If the result is YES, the control proceeds to the next step (S24 of FIG. 8).

As explained above, according to the mask pattern checking method of the second embodiment, the entire mask pattern 11 can be checked by a single scanning operation of the image acquirement unit 12 with respect to the check object regions B1~B3. Therefore, compared with the first embodiment, it is possible to detect defects E11, E12, E2 and E3 as shown in FIG. 6B in a shorter time.

FIGS. 10A to 10D illustrate modifications of the mask pattern checking apparatus shown in FIG. 3. Note, the same references as those employed in FIG. 3 indicate like constituent elements and thus the explanation thereof is omitted.

Figure 10A:
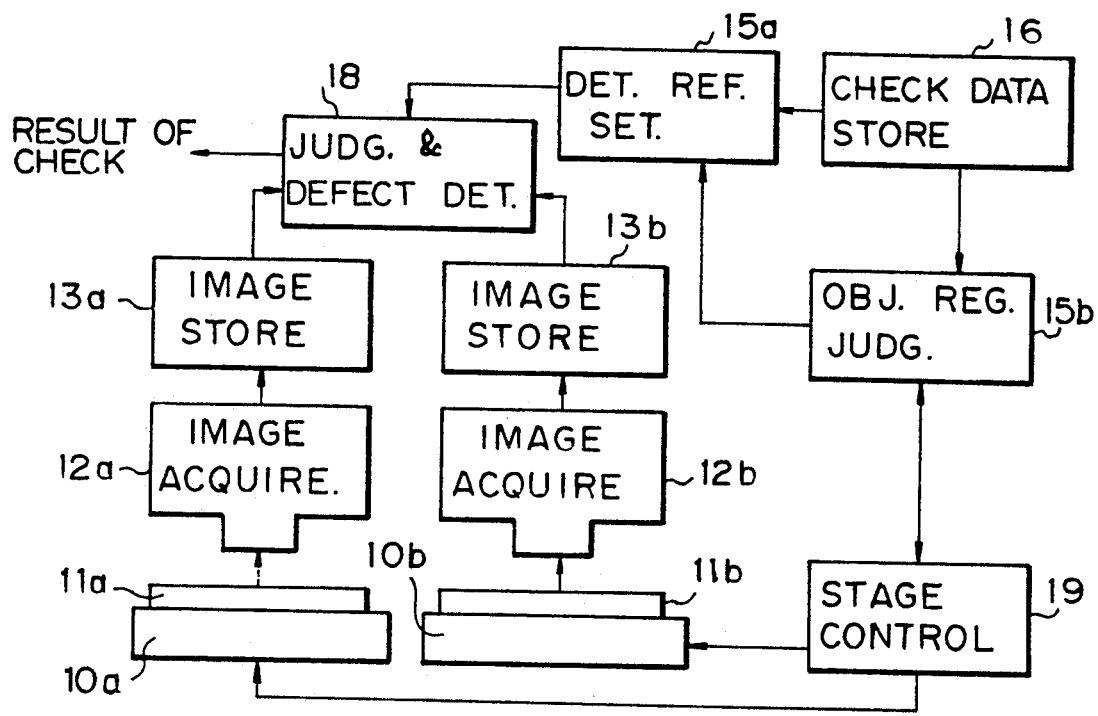
FIGS. 10A to 10D are block diagrams illustrating modifications of the mask pattern checking apparatus shown in FIG. 3.

The apparatus shown in FIG. 10A is characterized in that a pair of stages 10a,10b, a pair of mask patterns 11a,11b, a pair of image acquirement units 12a,12b and a pair of image store units 13a,13b are substituted for the stage 10, mask pattern 11, image acquirement unit 12 and image store unit 13 of FIG. 3, and that the pair of stages 10a,10b are driven by a stage control unit 19.

The defect detection is carried out by comparing acquired image data of the mask patterns 11a,11b. Namely, a judgement and defect detection unit 18 carries out defect detection based on the comparison of image data according to the mask pattern checking method of the first and second embodiments.

Figure 10B:
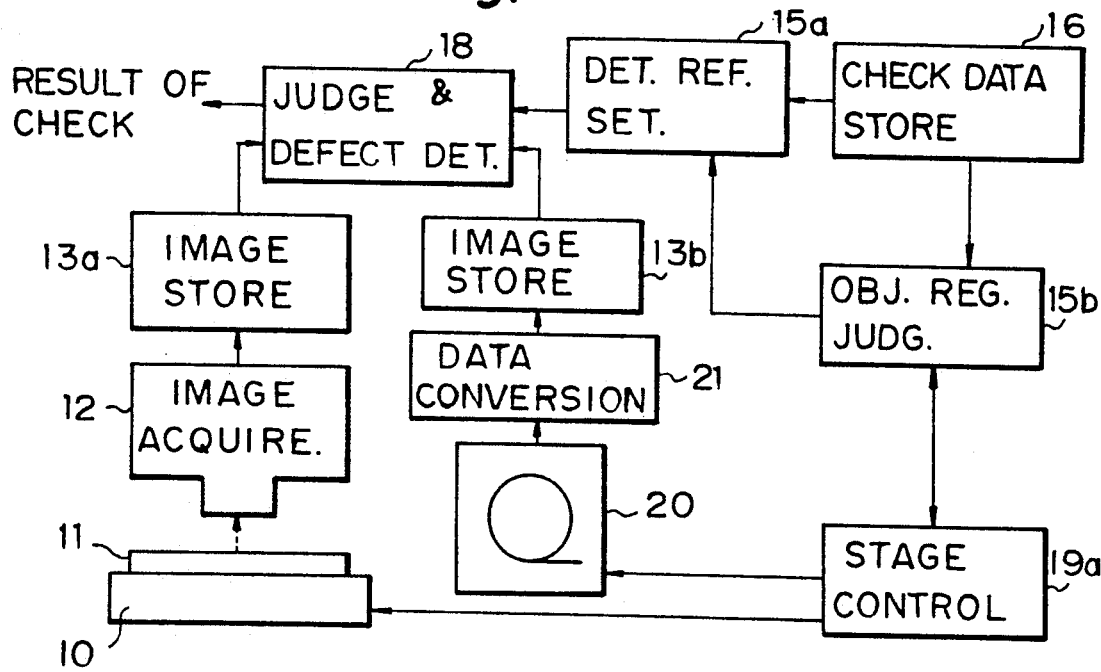

The apparatus shown in FIG. 10B is characterized in that a magnetic (tape) store unit 20 and a data conversion unit 21 are additionally provided and a pair of image store units 13a,13b are substituted for the image store unit 13 of FIG. 3, and that the stage 10 and magnetic store unit 20 are driven by a stage control unit 19a.

The defect detection is carried out by comparing acquired image data of the mask pattern 11 with design data stored in the magnetic store unit 20. The design data read from the magnetic store unit 20 is converted by the data conversion unit 21 into binary coded image data and stored in the image store unit 13b. In the same manner as in FIG. 10A, the judgement and defect detection unit 18 carries out defect detection according to the mask pattern checking method of the first and second embodiments.

Figure 10C:
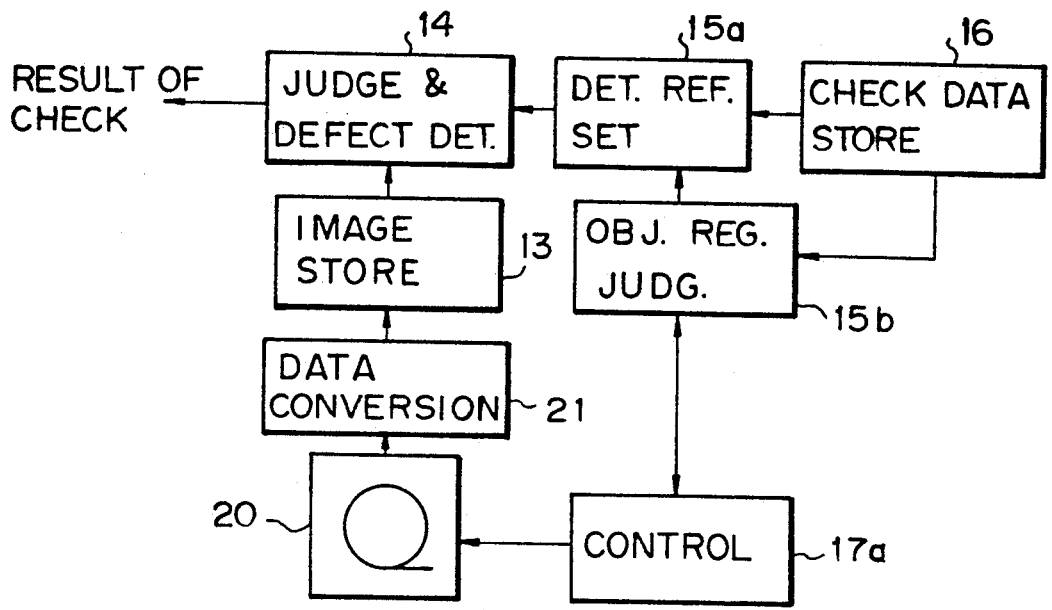

The apparatus shown in FIG. 10C is characterized in that a magnetic (tape) store unit 20 and a data conversion unit 21 are substituted for the stage 10, mask pattern 11 and image acquirement unit 12 of FIG. 3, and that the magnetic store unit 20 is controlled by a control unit 17a.

The defect detection is carried out based on data conversion (21) of the design data stored in the magnetic store unit 20. According to the constitution of FIG. 10C, it is possible to remove defects included in the design data, prior to the stage at which mask patterns are actually formed.

Figure 10D:
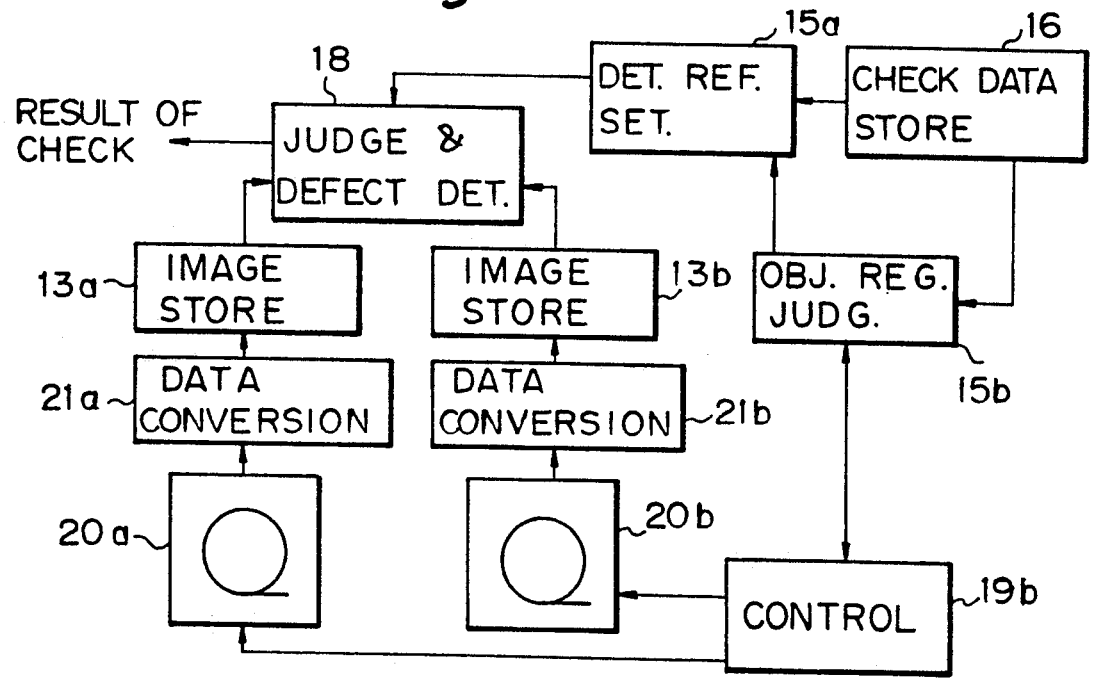

The apparatus shown in FIG. 10D is characterized in that a pair of magnetic (tape) store units 20a,20b, a pair of data conversion units 21a,21b and a pair of image store units 13a,13b are substituted for the stage 10, mask pattern 11, image acquirement unit 12 and image store unit 13 of FIG. 3, and that the pair of magnetic store units 20a,20b are driven by a control unit 19b.

The defect detection is carried out by converting design data stored in the magnetic store units 20a,20b into binary coded image data by the data conversion units 21a,21b and comparing the image data by the judgement and defect detection unit 18. In the same manner as in FIG. 10C, it is possible to detect defects included in the design data, prior to the stage of forming mask patterns.

Although the present invention has been disclosed and described by way of several embodiments, it is apparent to those skilled in the art that other embodiments and modifications of the present invention are possible without departing from the spirit or essential features thereof.

We claim:

1. A method of checking a mask pattern having a plurality of contiguous mask pattern regions, each of the mask pattern regions formed based on different design pattern rules, said method comprising the steps of:
   (a) respectively assigning the contiguous mask pattern regions to different contiguous check object regions;
   (b) setting a different defect detection reference for each of the different contiguous check object regions which correspond to respective ones of the different design pattern rules;
   (c) individually detecting presence or absence of defects in a relatively large one of the check object regions based on a relatively coarse defect detection reference corresponding to the relatively large check object region; and
   (d) based on the results of the detecting of said step (c), individually detecting presence or absence of defects in a relatively small one of the check object regions based on a relatively fine defect detection reference corresponding to the relatively small check object region.

2. A method as set forth in claim 1, wherein said detecting steps (c) and (d) each comprise detecting substeps, a sum of a number of the detecting substeps of both steps (b) and (c) being equal to a number of the check object regions.

3. A method as set forth in claim 1, further comprising the steps of:
   (e) scanning the entire mask pattern to input an image before said step (c);
   (f) judging whether or not a scanning point enters a check object region corresponding to a different defect detection reference; and
   (g) changing a current defect detection reference to a defect detection reference corresponding to the check object region which the scanning point enters.

4. An apparatus for checking a mask pattern including a plurality of contiguous mask pattern regions formed based on different design pattern rules, said apparatus comprising:
   first means for storing a defect detection reference corresponding to each of the design pattern rules;
   second means for determining a resolution of features in each of a plurality of contiguous check object regions based on the defect detection reference for each of the design pattern rules stored in said first means;
   third means for acquiring an image of a mask pattern to be checked; and
   fourth means for individually comparing a relatively large one of the check object regions of the image acquired by said third means with a relatively coarse defect detection reference corresponding to the relatively large check object region set by the second means, judging a result of the comparing and, depending on a result of the judging, individually comparing a relatively small one of the check object regions of the image acquired by said third means with a relatively fine defect detection reference corresponding to the relatively small check object region.

5. An apparatus as set forth in claim 4, wherein said second means comprises
   means for judging a check object region based on information concerning coordinates and positions, and
   means for determining a corresponding defect detection reference according to the judged check object region.

* * * * *

UNITED STATES PATENT AND TRADEMARK OFFICE
CERTIFICATE OF CORRECTION

PATENT NO. : 5,287,290

DATED : February 15, 1994

INVENTOR(S) : Katsuji TABARA et al.

It is certified that error appears in the above-identified patent and that said Letters Patent is hereby corrected as shown below:

Column 3, line 61, change "$\epsilon$" to -----.

Signed and Sealed this

Thirtieth Day of August, 1994

Attest:

BRUCE LEHMAN

*Attesting Officer*   *Commissioner of Patents and Trademarks*